United States Patent
Nam et al.

(10) Patent No.: US 9,851,632 B2
(45) Date of Patent: Dec. 26, 2017

(54) PHASE-SHIFT BLANKMASK AND PHOTOMASK

(71) Applicant: S&S TECH Co., Ltd., Daegu-si (KR)

(72) Inventors: Kee-Soo Nam, Daegu-si (KR); Cheol Shin, Daegu-si (KR); Chul-Kyu Yang, Daegu-si (KR); Jong-Hwa Lee, Daegu-si (KR); Min-Ki Choi, Daegu-si (KR); Chang-Jun Kim, Daegu-si (KR); Kyu-Jin Jang, Daegu-si (KR)

(73) Assignee: S&S TECH CO., LTD., Daegu-si (KR)

( * ) Notice: Subject to any disclaimer, the term of this patent is extended or adjusted under 35 U.S.C. 154(b) by 223 days.

(21) Appl. No.: 14/804,568

(22) Filed: Jul. 21, 2015

(65) Prior Publication Data
US 2016/0054650 A1   Feb. 25, 2016

(30) Foreign Application Priority Data

Aug. 25, 2014  (KR) .................. 10-2014-0110771
Mar. 20, 2015  (KR) .................. 10-2015-0038683
Apr. 6, 2015   (KR) .................. 10-2015-0048095

(51) Int. Cl.
*G03F 1/26* (2012.01)

(52) U.S. Cl.
CPC ....................... *G03F 1/26* (2013.01)

(58) Field of Classification Search
CPC .......................................... G03F 1/26
USPC ............................................. 430/5
See application file for complete search history.

(56) References Cited

U.S. PATENT DOCUMENTS

2007/0020534 A1   1/2007   Yoshikawa

FOREIGN PATENT DOCUMENTS

| JP | 2006-146151 A | 6/2006 |
|----|---------------|--------|
| JP | 2006-146152 A | 6/2006 |
| JP | 2009-271562 A | 11/2009 |
| JP | 2011-209762 A | 10/2011 |
| JP | 2011-215657 A | 10/2011 |
| KR | 10-2007-0096922 | 2/2007 |
| KR | 10-2008-0022893 A | 3/2008 |
| KR | 10-2010-0002067 | 6/2010 |
| KR | 20110002056 A | 1/2011 |
| KR | 10-2012-0057502 | 5/2012 |
| KR | 10-2014-0095955 | 4/2014 |
| TW | 201019044 A | 5/2010 |
| TW | 201222142 A | 6/2012 |

OTHER PUBLICATIONS

Office Action from Japanese Patent Office in the counterpart Application No. 2015-142712 in Japanese.
Office Action from Taiwanese Patent Office in the counterpart Application No. 104123619 in Chinese.

*Primary Examiner* — Christopher Young
(74) *Attorney, Agent, or Firm* — Juan Carlos A. Marquez; Marquez IP Law Office, PLLC

(57) ABSTRACT

Disclosed is a phase-shift blankmask, in which a light-shielding film includes a metal compound and having a structure of a multi-layer film or a continuous film, which includes a first light-shielding layer and a second light-shielding layer. The second light-shielding layer has higher optical density at an exposure wavelength per unit thickness (Å) than the first light-shielding layer. The first light-shielding layer occupies 70% to 90% of the whole thickness of the light-shielding film. With this, the blankmask secures a light-shielding effect, has an improved etching speed, and makes a resist film thinner, thereby achieving a fine pattern.

17 Claims, 2 Drawing Sheets

[Fig.1]
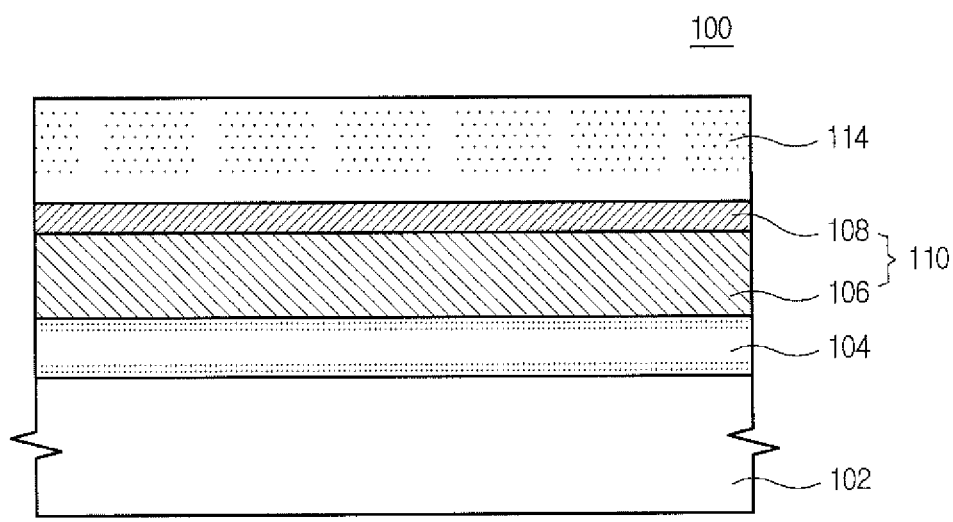
[Fig.2]
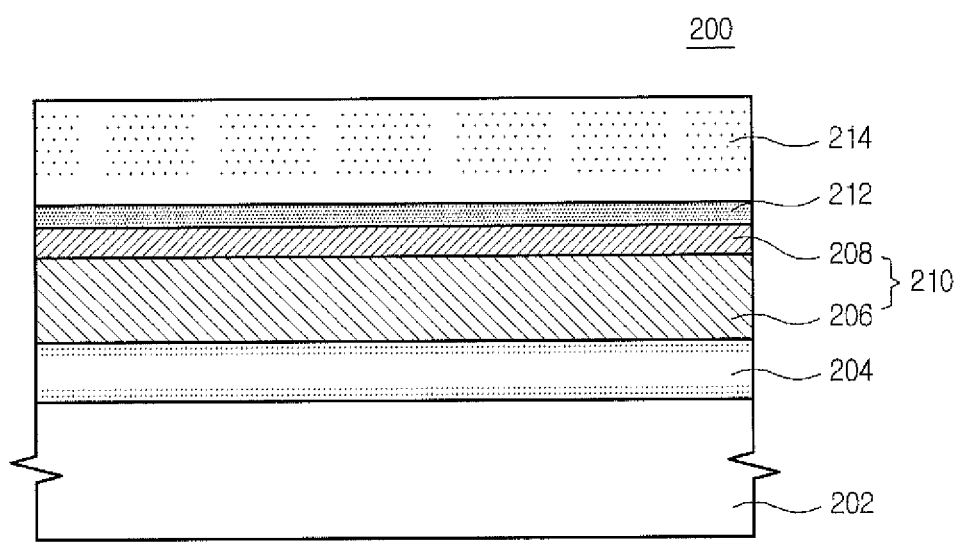

[Fig.3]
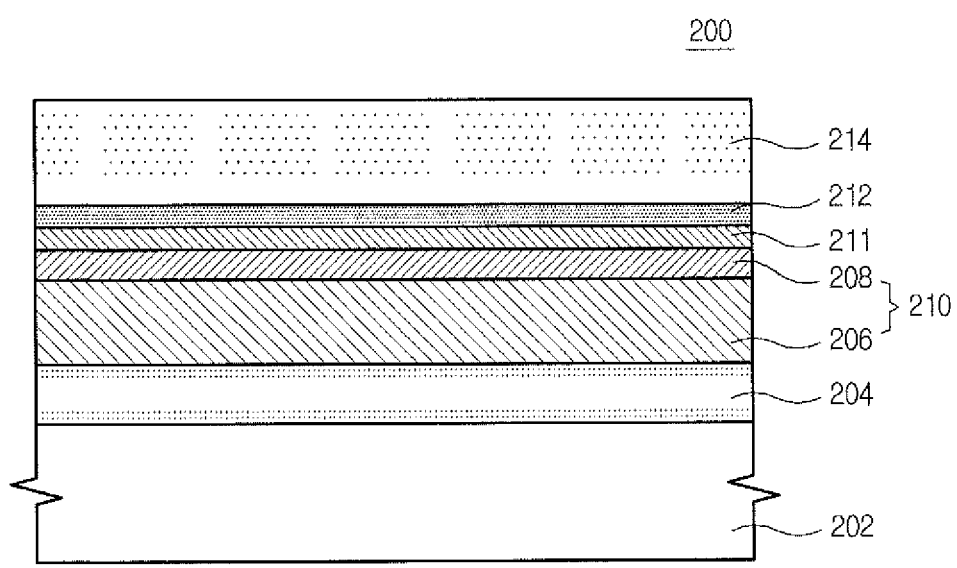

PHASE-SHIFT BLANKMASK AND PHOTOMASK

CROSS-REFERENCE TO RELATED APPLICATION

This application claims priority to and the benefit of Korean Patent Application Nos. 10-2014-0110771 filed on Aug. 25, 2014, 10-2015-0038683 filed on Mar. 20, 2015 and 10-2015-0048095 filed on Apr. 6, 2015, the disclosure of which is incorporated herein by reference in its entirety.

BACKGROUND

1. Field of the Invention

The present invention relates to a phase-shift blankmask and a photomask, and more particularly to a phase-shift blankmask and a photomask which can achieve a fine pattern of not greater than 32 nm, preferably not greater than 14 nm, and more preferably not greater than 10 nm.

2. Discussion of Related Art

Today, as a need for a fine circuit pattern has been accompanied by high integration of large-scale integrated circuits (ICs), high semiconductor microfabrication process technology has emerged as a very important issue.

To this end, lithography technology has been developed up to a binary intensity blankmask, a phase-shift blankmask using a phase-shift film, a hardmask binary blankmask having a hard film and a light-shielding film, etc. so as to improve a resolution of a semiconductor circuit pattern. Such a blankmask is to fabricate a photomask with a high resolution and superior quality, and has been developed to get a finer pattern by making a film formed on a substrate thinner, controlling an etching speed of the film or the like method.

Among them, the phase-shift blankmask employs interference of light based on a predetermined phase difference (e.g., 170° to 190°) between exposure light passed through a transparent substrate and the exposure light passed through a phase-shifter, and has attracted attention as technology of forming a fine pattern for a semiconductor device since it can improve a resolution of a transfer pattern.

A conventional phase-shift blankmask has a structure where a phase-shift film, a light-shielding film having a light-shielding layer and an anti-reflective layer, and a resist film are stacked on a transparent substrate. The light-shielding film has a predetermined thickness to properly shield light and lower reflectivity, and the resist film is thick enough to serve as a mask in a process of etching the light-shielding film. As the resist film is thick, the resist film has a deviation in a critical dimension due to a loading effect while forming a pattern, thereby causing a defect in the pattern. Accordingly, there is a need of making the resist film thinner to effectively reduce the loading effect.

The thickness of the resist film is affected by the etching speed and thickness of the light-shielding film, and the resist film has relatively low etch selectivity under a dry etching condition for forming the pattern of the light-shielding film. Accordingly, the thickness of the light-shielding film has to be reduced in order to make the resist film thinner. However, a problem arises in that the reduced thickness of the light-shielding film cannot satisfy required optical properties, e.g., optical density, reflectivity, etc. Further, there has been proposed a method of adding oxygen (O) to a metal compound of the light-shielding film to increase the etching speed of the light-shielding film and thus make the resist film thinner. However, the light-shielding film containing oxygen (O) has a problem of increasing sheet resistance under a certain condition due to a composition ratio, a fabrication process, etc.

SUMMARY OF THE INVENTION

The present invention is directed to a phase-shift blankmask having a light-shielding film which not only secures a light-shielding effect but also has an improved etching speed, and a photomask using the same.

Further, the present invention is directed to a phase-shift blankmask having a light-shielding film which has not only an improved etching speed but also a low sheet resistance, and a photomask using the same.

In addition, the present invention is directed to a phase-shift blankmask in which a resist film is thinly formed to prevent a resist pattern from being damaged, and a fine pattern is achieved to secure a high pattern accuracy, and a photomask using the same.

According to an aspect of the present invention, there is provided a phase-shift blankmask, in which a phase-shift film and a light-shielding film are formed on a transparent substrate, the light-shielding film including a metal compound and having one structure between a multi-layer film and a continuous film, which includes a first light-shielding layer formed adjacent to the transparent substrate, and a second light-shielding layer formed on the first light-shielding layer, wherein the second light-shielding layer has higher optical density at an exposure wavelength per unit thickness (Å) than the first light-shielding layer.

The first light-shielding layer may be formed to occupy 50% to 95% of the whole thickness of the light-shielding film.

The first and second light-shielding layers may be different in a composition ratio from each other while having the same composition of materials, or different in the composition of materials, and the first light-shielding layer may be more quickly etched in the same etching material than the second light-shielding layer.

The first light-shielding layer may include one selected from a group consisting of CrO, CrON, CrCO and CrCON, and the second light-shielding layer may include one selected from a group consisting of CrN, CrO, CrC, CrON, CrCN, CrCO and CrCON.

The light-shielding film may include a chrome (Cr) compound that contains at least one selected from a group consisting of nitrogen (N), oxygen (O), carbon (C), boron (B) and hydrogen (H). In this case, the first light-shielding layer may contain oxygen (O) of 1 at % to 50 at %, and contain nitrogen (N) of 10 at % to 30 at % if containing nitrogen (N). The first light-shielding layer may contain oxygen (O) of 1 at % to 50 at %, and the second light-shielding layer may contain oxygen (O) of 1 at % to 20 at %. The second light-shielding layer may essentially include carbon (C), and the first light-shielding layer may include higher content of at least one of oxygen (O) and nitrogen (N) than the second light-shielding layer. The first light-shielding layer may include carbon (C) of 0 to 40 at %, and the second light-shielding layer may include carbon (C) of 1 at % to 50 at %, and the second light-shielding layer may include higher content of carbon (C) than the first light-shielding layer. The second light-shielding layer may essentially include carbon (C), and the structure where the phase-shift film and the light-shielding film are stacked may include a sheet resistance of not greater than 30 kΩ/□.

The light-shielding film may include a thickness of 450 Å to 700 Å.

The phase-shift film may include a multi-layer film of two or more layers of a molybdenum silicide (MoSi) compound that contains at least one of materials selected from a group consisting of nitrogen (N), oxygen (O), carbon (C), boron (B) and hydrogen (H), and the phase-shift film may include an uppermost layer that contains oxygen (O) of 0.1 at % to 20 at % and has a thickness of 1 Å to 100 Å.

The structure where the phase-shift film and the light-shielding film are stacked may have an optical density of 2.5 to 3.5 and a surface reflectivity of 20% to 40% with regard to an exposure light wavelength of 193 nm or 248 nm.

A hard film may be further provided on a light-shielding film of the phase-shift film, and an etch-stopping film may be selectively provided in between the light-shielding film and the hard film.

The hard film may include a thickness of 20 Å to 100 Å.

The light-shielding film, the phase-shift film, the hard film and the etch-stopping film may include one or more materials selected from a group consisting of silicon (Si), molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf), tungsten (W) and silicon (Si), or the foregoing materials with added one or more materials selected from a group consisting of nitrogen (N), oxygen (O), carbon (C), boron (B) and hydrogen (H).

According to another aspect of the present invention, there is provided a phase-shift photomask fabricated using the foregoing phase-shift blankmask.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a cross-sectional view of a phase-shift blankmask according to a first embodiment of the present invention;

FIG. 2 is a cross-sectional view of a phase-shift blankmask according to a second embodiment of the present invention; and FIG. 3 shows a modification of FIG. 2.

DETAILED DESCRIPTION OF EXEMPLARY EMBODIMENTS

Hereinafter, exemplary embodiments of the present invention will be described in more detail with reference to the accompanying drawings.

FIG. 1 is a cross-sectional view of a phase-shift blankmask according to a first embodiment of the present invention.

Referring to FIG. 1, a phase-shift blankmask 100 according to the present invention includes a transparent substrate 102; and a phase-shift film 104, a light-shielding film 110 and a resist film 114 which are stacked in sequence on the transparent substrate 102.

The transparent substrate 102 is made of fused silica, synthesized fused silica, fluorine doped fused silica, etc. The flatness of the transparent substrate 102 affects the flatness of one among the thin films such as the phase-shift film 104, the light-shielding film 110, etc. formed thereon. If the flatness of the growing film surface is defined as total indicator reading (TIR), it is controlled to be not greater than 300 nm, and preferably than 200 nm within an area of 142 $mm^2$.

The phase-shift film 104 includes a silicide that contains silicon (Si) or transition metal such as molybdenum (Mo), or a compound that contains one or more light elements among nitrogen (N), oxygen (O), carbon (C) with them. The phase-shift film 104 preferably includes one among Si, SiN, SiC, SiO, SiCN, SiCO, SiNO, SiCON, MoSi, MoSiN, MoSiC, MoSiO, MoSiCN, MoSiCO, MoSiNO and MoSiCON, and may additionally include one or more light elements such as boron (B) and hydrogen (H) by taking a fabrication process and the optical, chemical and physical properties of the phase-shift film 104 into account.

The phase-shift film 104 is formed using one target having the same composition, for example, using a target of transition metal silicide (Si) or a target of transition metal silicide (Si) with added boron (B). In the target, a ratio of transition metal:silicon (Si) may be 1% to 40%:99% to 60%, or a ratio of transition metal:silicon (Si):boron (B) may be 1% to 40%:98% to 50%:1% to 10%.

The phase-shift film 104 may be structured in the form of a single-layer film, a multi-layer film of two or more layers, or a continuous film, and each film may be a single film or a continuous film in which a composition ratio is continuously varied.

The uppermost layer of the phase-shift film 104 may have to essentially contain oxygen (O). For instance, if the phase-shift film 104 includes a compound of MoSi, the phase-shift film 104 may be easily damaged by a cleaning solution containing ($O_3$), Hot-DI and ammonia ($NH_4OH$), sulfuric acid ($H_2SO_4$), etc. If the phase-shift film 104 is damaged by the foregoing materials during a cleaning process or the like process, the phase-shift film 104 cannot satisfy the required optical properties since it becomes thinner, increases in transmissivity and changes in a degree of phase shift. According to an embodiment of the present invention, the uppermost layer of the phase-shift film 104 is formed to necessarily contain oxygen (O), for example, MoSiON, so that the phase-shift film 104 can be prevented from deteriorating (e.g., being dissolved or corroded) by the cleaning solution. In the uppermost layer of the phase-shift film 104, content of oxygen (O) is 0.1 at % to 20 at %. Further, a film arranged under the uppermost layer may be different in composition or a composition ratio from the uppermost layer.

The phase-shift film 104 may have a thickness of 300 Å to 850 Å, and preferably a thickness of 500 Å to 650 Å. The uppermost layer of the phase-shift film 104 may have a thickness of 10 Å to 100 Å, which corresponds to 1% to 40%, and preferably 1% to 10% of the whole thickness of the phase-shift film 104. The phase-shift film 104 may be provided in the form of a continuous film in which a composition ratio is continuously varied to make the uppermost portion contain oxygen (O).

The phase-shift film 104 has a transmissivity of 6% to 30% with regard to exposure light having a wavelength of 193 nm or 248 nm, a degree of phase shift of 170° to 190°, and a surface reflectivity of 20% to 30%. If the transmissivity of the phase-shift film 104 is lower than 6%, the effects of the phase shift are poor since the intensity of the exposure light for destructive interference is low when the resist film applied to a wafer is exposed to the exposure light. On the other hand, if the transmissivity is higher than 30%, the resist film applied to the wafer is damaged, thereby causing a loss of the resist film.

The phase-shift film 104 may selectively undergo thermal treatment at a temperature of 100° C. to 500° C. so as to control its chemical resistance and flatness.

The light-shielding film 110 is formed with a material that has etch selectivity with regard to the phase-shift film 104, and may include transition metal or a compound that contains one or more light elements among oxygen (O), nitrogen (N) and carbon (C) in the transition metal. The light-shielding film 110 may for example contain chrome (Cr) or a chrome (Cr) compound such as CrN, CrO, CrC, CrON, CrCN, CrCO or CrCON. Further, the light-shielding film 110 may additionally contain at least one of light elements such as boron (B) and hydrogen (H) as necessary.

The light-shielding film 110 may for example have a two-layer structure of a first light-shielding layer 106 and a second light-shielding layer 108. In consideration of a pattern aspect ratio in a pattern forming process and the optical properties of the films, it is preferable that the light-shielding film 110 has a multi-layer structure of two or more layers. The first light-shielding layer 106 and the second light-shielding layer 108, which constitute the light-shielding film 110, may be different in a composition ratio from each other while having the same composition of materials, or may be different in the composition of materials. Further, the first light-shielding layer may be formed to be more quickly etched than the second light-shielding layer with regard to the same etching material.

The first light-shielding layer 106 serves to adjust optical density (OD) of the light-shielding film 110, and the second light-shielding layer 108 serves to supplement the optical density. If only the first light-shielding layer 106 is used to adjust the optical density, the first light-shielding layer 106 has to become thicker so as to satisfy the optical properties required for the light-shielding film 110. Therefore, the second light-shielding layer 108 is formed to supplement the optical density needed for the light-shielding film 110. To this end, the second light-shielding layer 108 is formed to have higher optical density at an exposure wavelength per unit thickness (Å) than the first light-shielding layer 106.

The light-shielding film 110 may have a thickness of 450 Å to 700 Å, and preferably a thickness of 500 Å to 650 Å to achieve a pattern of high resolution. If the light-shielding film 110 is thinner than 450 Å, the optical density is lowered to not higher than 2.5. On the other hand, if the light-shielding film 110 is thicker than 700 Å, the aspect ratio of the pattern is equal to or higher than 2, thereby damaging the pattern of the resist film and increasing a defect.

To control the optical density of the light-shielding film 110, the first light-shielding layer 106 has a thickness corresponding to 50% to 95% and preferably 70% to 90% of the thickness of the light-shielding film 110. To supplement the optical density, the second light-shielding layer 108 has a thickness corresponding to 5% to 50% and preferably 10% to 30% of the thickness of the light-shielding film 110.

As the first light-shielding layer 106 occupies most of the whole thickness of the light-shielding film 110, the first light-shielding layer 106 has to be more quickly etched than the second light-shielding layer 108 so as to get a better etching result in view of a sectional inclination when the pattern of the light-shielding film 110 is formed. To this end, the first light-shielding layer 106 contains one or more between oxygen (O) and nitrogen (N), and in particular essentially contains oxygen (O). For example, the first light-shielding layer 106 includes a chrome (Cr) compound such as CrO, CrCO, CrON or CrCON. In the first light-shielding layer 106, content of chrome (Cr) is 20 at % to 70 at %, content of nitrogen (N) is 0 at % to 50 at %, content of oxygen (O) is 1 at % to 50 at %, content of carbon (C) is 0 to 40 at %, content of boron (B) is 0 to 30 at %, and content of hydrogen (H) is 0 to 30 at %. In the first light-shielding layer 106, content of oxygen (O) may be preferably 5 at % to 40 at % and more preferably 10 at % to 20 at %, and content of nitrogen (N) may be preferably 10 at % to 30 at % if nitrogen (N) is contained.

The second light-shielding layer 108 may for example include chrome (Cr) or a chrome (Cr) compound such as CrN, CrO, CrC, CrON, CrCN, CrCO or CrCON.

The second light-shielding layer 108 may be formed not to contain oxygen (O) to become thinner and properly shield light. However, the second light-shielding layer 108 may contain a small amount of oxygen (O) to secure a light-shielding effect and improve an etching speed. Although oxygen (O) contained in the second light-shielding layer 108 makes the second light-shielding layer 108 become thicker than that containing no oxygen (O) to secure a certain light-shielding effect, oxygen (O) makes the etching speed higher and therefore similar effects are expected with respect to etching time and the thickness of the resist film.

If the second light-shielding layer 108 is formed not to contain oxygen (O), the second light-shielding layer 108 includes chrome (Cr) of 20 at % to 70 at %, nitrogen (N) of 0 to 30 at %, carbon (C) of 0 to 30 at %, boron (B) of 0 to 30 at %, and hydrogen (H) of 0 to 30 at %. Further, content of chrome (Cr) may be preferably 30 at % to 60 at %, and more preferably 40 at % to 50 at %%.

On the other hand, if the second light-shielding layer 108 is formed to contain oxygen (O), the second light-shielding layer 108 includes chrome (Cr) of 20 at % to 70 at %, nitrogen (N) of 0 to 50 at %, oxygen (O) of 1 at % to 20 at %, carbon (C) of 0 to 30 at %, boron (B) of 0 to 30 at %, and hydrogen (H) of 0 to 30 at %. Further, content of chrome (Cr) may be preferably 30 at % to 60 at %, and more preferably 40 at % to 50 at %. In this case, the first light-shielding layer 106 is different in content of oxygen (O) by 4 at % to 49 at % from the second light-shielding layer 108.

If the content of oxygen (O) in the second light-shielding layer 108 is less than 1 at %, there is a problem of lowering the etching speed. On the other hand, if the content of oxygen (O) is more than 20 at %, resistance to fluorine (F) gas used for etching the phase-shift film 104 is weakened and thus the second light-shielding layer 108 is damaged when the phase-shift film 104 is etched, thereby causing a problem of lowering the optical density.

In addition, the second light-shielding layer 108 may further contain carbon (C) in order to improve sheet resistance of thin films that compose the blankmask, if the sheet resistance increases as the light-shielding film 110 includes one or more between oxygen (O) and nitrogen (N). In detail, the light-shielding film 110 may increase in the sheet resistance due to oxygen (O) or nitrogen (N) contained therein, and thus image distortion may be caused by a charge-up phenomenon when the photomask is fabricated. This may make it difficult to fabricate the photomask itself. Accordingly, the second light-shielding layer 108 is formed to contain carbon (C) so that the sheet resistance can be improved, thereby achieving the photomask with high quality. In the second light-shielding layer 108, content of carbon (C) is 1 to 50 at %. If the content of carbon (C) in the second light-shielding layer 108 is less than 1 at %, a problem occurs at electron (E)-beam writing since the sheet resistance increases. On the other hand, if the content of carbon (C) is more than 50 at %, the second light-shielding layer 108 for ultimately satisfying the optical density becomes thicker since the optical density decreases. In this case, carbon (C) contained in the second light-shielding layer 108 causes the phase-shift film 104 and the stacked structure of the light-shielding film 110 to have a sheet resistance of 30 kΩ/□ or lower, preferably 10 kΩ/□ or lower, and more preferably 3 kΩ/□ or lower.

Further, the first light-shielding layer 106 may additionally contain carbon (C) for improving the sheet resistance. In this case, the second light-shielding layer 108 has higher content of carbon (C) than the first light-shielding layer 106. The first light-shielding layer 106 and the second light-shielding layer 108 may further contain light elements such as boron (B), hydrogen (H), etc. if needed.

If the light-shielding film 110 contains one or more between oxygen (O) and nitrogen (N), it is advantageous to increase the etching speed of the light-shielding film 110. By the way, if the first light-shielding layer 106 is thicker than the second light-shielding layer 108, the first light-shielding layer 106 is formed to have more content of at least one between oxygen (O) and nitrogen (N) than that of the second light-shielding layer 108 so that the etching speed of the first light-shielding layer 106 can be higher than that of the second light-shielding layer 108.

The light-shielding film 110 may selectively undergo surface thermal treatment. At this time, the thermal treatment for the light-shielding film 110 may be performed at a temperature equal to or lower than the temperature of the thermal treatment for the phase-shift film 104.

The film where the phase-shift film 104 and the light-shielding film 110 are stacked in sequence has an optical density of 2.5 to 3.5 and preferably 2.7 to 3.5 with respect to the exposure light having a wavelength of 193 nm or 248 nm, and a surface reflectivity of 20% to 40% and preferably 25% to 35%.

As the etching speed of the light-shielding film 110 increases, the resist film 114 has a thickness of not greater than 1,500 Å, preferably not greater than 1,200 Å, and more preferably not greater than 1,000 Å. The resist film to be used at this time may be equally applied to positive- and negative-type resists.

FIG. 2 is a cross-sectional view of a phase-shift blankmask according to a second embodiment of the present invention.

Referring to FIG. 2, a phase-shift blankmask 200 according to an embodiment of the present invention includes a transparent substrate 202; and a phase-shift film 204, a light-shielding film 210, a hard film 212 and a resist film 214 which are stacked in sequence on the transparent substrate 202. In the second embodiment, the phase-shift film 204, the light-shielding film 210 and the resist film 214 have the same optical, chemical and physical properties as those of the first embodiment.

The hard film 212 is formed to include one or more kinds of metal selected from a group consisting of chrome (Cr), silicon (Si), molybdenum (Mo) and tantalum (Ta), or selectively, to further include one or more kinds of materials selected from a group consisting of oxygen (O), nitrogen (N), carbon (C), boron (B) and hydrogen (H). The hard film 212 may, for example, include chrome (Cr), a chrome (Cr) compound that contains a light element in addition to chrome (Cr), molybdenum silicide (MoSi), a molybdenum silicide (MoSi) compound that contains a light element in addition to molybdenum silicide (MoSi), or a silicon (Si) compound.

The hard film 212 has an etch selectivity higher than 10 with regard to an etching condition for the light-shielding film 210 in order to serve as an etching mask for the light-shielding film 210. Therefore, if the light-shielding film 210 includes the chrome (Cr) compound, the hard film 212 may include a material that can be etched by fluorine (F) gas while having etch resistance to chlorine (Cl) gas, for example, molybdenum silicide (MoSi), a molybdenum silicide (MoSi) compound that contains a light element in addition to molybdenum silicide (MoSi), or a silicon (Si) compound.

If the hard film 212 includes chrome (Cr) and a chrome (Cr) compound that contains a light element in addition to chrome (Cr), an etch-stopping film 211 having a thickness of 20 Å to 30 Å may be added in between the light-shielding film 210 and the hard film 212 as shown in FIG. 3. The etch-stopping film 211 may include silicon (Si), molybdenum silicide (MoSi) or tantalum (Ta); or a compound that contains oxygen (O), nitrogen (N), carbon (C) or boron (B) in addition to silicon (Si), molybdenum silicide (MoSi) or tantalum (Ta). The etch-stopping film 211 has a thickness of 20 Å to 150 Å and preferably 30 Å to 100 Å.

The higher the etching speed of the hard film 212, the thinner the resist film 214. Thus, the hard film 212 has an etching speed of 0.4 Å/sec or higher, and preferably 1.0 Å/sec or higher.

The hard film 212 has a thickness of 20 Å to 100 Å, and preferably 30 Å to 60 Å. If the hard film 212 is thicker than 100 Å, a deviation in a critical dimension becomes higher due to a loading effect when the resist film 214 is used as an etching mask to etch the hard film 212. On the other hand, if the hard film 212 is thinner than 20 Å, it is difficult for the resist film 214 to serve as the etching mask since etch selectivity is lowered with regard to the light-shielding film 210.

Further, the phase-shift film 204, the light-shielding film 210, the etch-stopping film 211 and the hard film 212 have etch selectivity with respect to the adjacent films, and may include one or more kinds of materials selected from a group consisting of silicon (Si), molybdenum (Mo), tantalum (Ta), vanadium (V), cobalt (Co), nickel (Ni), zirconium (Zr), niobium (Nb), palladium (Pd), zinc (Zn), chrome (Cr), aluminum (Al), manganese (Mn), cadmium (Cd), magnesium (Mg), lithium (Li), selenium (Se), copper (Cu), hafnium (Hf), tungsten (W), tin (Sn), or, the foregoing materials with added one kinds of materials selected from a group consisting of nitrogen (N), oxygen (O), carbon (C), boron (B) and hydrogen (H).

In addition, an upper surface of the hard film 212 may undergo either of surface modification or surface treatment reformation so as to improve adhesion with the resist film 214. The surface modification of the hard film 212 may be performed by thermal treatment or plasma treatment using one or more kinds of gas selected from a group consisting of oxygen (O), nitrogen (N), hydrogen (H), carbon (C) and fluorine (F). The thermal treatment and the plasma treatment may be achieved by a method of using a vacuum rapid thermal treatment device and a method of using atmospheric pressure plasma without limitation. Through the surface modification, the surface of the hard film 212 has a contact angle of 15° to 50°, and preferably, 20° to 45°. If the contact angle is smaller than 15°, there is a problem that the resist film is partially coated or uncoated. On the other hand, if the contact angle is greater than 50°, revolutions per minute (RPM) for coating increases due to high surface energy or the thickness of the resist film is not uniform.

The surface treatment may be performed by applying a polymer compound containing silicon. The polymer compound containing silicon may include one or more among hexamethyldisilane, trimethylsilyldiethyl-amine, O-trimethylsilylacetate, O-trimethylsilyl-proprionate, O-trimethylsilylbutyrate, trimethylsilyl-trifluoroacetate, trimethylmethoxysilane, N-methyl-Ntrimethylsilyltrifluoroacetate, O-trimethylsilyacetylacetone, isopropenoxy-trimethylsilane, trimethylsilyl-trifluoroacetamide, methyltrimethyl-Silyldimethylketoneacetate, trimethyl-ethoxysilane.

Below, the phase-shift blankmask according to an embodiment of the present invention will be described in detail.

Embodiments

Evaluation I of Properties Based on Materials for Light-Shielding Film

To specify materials and their contents for the light-shielding film provided in the phase-shift blankmask according to an embodiment of the present invention, chrome (Cr) compounds having different composition ratios were evaluated with respect to the etching speed and film properties.

The light-shielding film was grown on a transparent substrate by a direct current (DC) magnetron sputtering apparatus with a chrome (Cr) target.

Table 1 shows that an etching speed of a metal film containing chrome (Cr) as major element is varied depending on the kinds of light element contained therein.

TABLE 1

|  | Materials for films | | | |
|---|---|---|---|---|
|  | CrC | Cr | CrN | CrON |
| Process gas (sccm) | Ar:CH4 (5:3) | Ar (8) | Ar:N2 (5:3) | Ar:N2:NO (5:3:3) |
| Process power (KW) | 0.7 | 0.7 | 0.7 | 0.7 |
| Etching speed (Å/sec) | 0.4 | 0.9 | 1.3 | 1.8 |

Referring to Table 1, the etching speed of the chrome (Cr) compounds was high in order of chrome carbide (CrC), chrome (Cr), chrome nitride (CrN) and chrome oxynitride (CrON). Thus, it is appreciated that the film containing nitrogen (N) or oxygen (O) increases in the etching speed among the films containing the chrome (Cr) compound.

Table 2 shows that the etching speed and optical density of the metal film containing the chrome (Cr) compound are varied depending on composition ratios of oxygen (O) and nitrogen (N).

TABLE 2

|  | Materials | | | |
|---|---|---|---|---|
|  | CrON | CrON | CrON | CrON |
| Process gas (sccm) | Ar:N2:NO = 5:3:3 | Ar:N2:NO = 5:3:5 | Ar:N2:NO = 5:5:5 | Ar:N2:NO = 5:10:5 |
| Process power (KW) | 0.7 | 0.7 | 0.7 | 0.7 |
| Film thickness (Å) | 462 | 465 | 460 | 464 |
| Etching speed (Å/sec) | 1.8 | 2.0 | 2.2 | 2.5 |
| OD @193 nm | 2.63 | 2.52 | 2.48 | 2.41 |

Referring to Table 2, it is appreciated that the etching speed increases but the optical density decreases as the contents of oxygen (O) and nitrogen (N) increase with respect to chrome (Cr). Therefore, if the light-shielding film is formed using a single film of chrome oxynitride (CrON), it has to become thicker to satisfy the required optical properties. Accordingly, it is appreciated that a separate film is needed to secure the optical density.

Table 3 shows resistance of a metal film by measuring the thickness and optical density of the film containing chrome oxynitride (CrON), which are varied under fluorine (F) etching gas depending on content of oxygen (O).

TABLE 3

|  | Materials for films | | | |
|---|---|---|---|---|
|  | CrON | CrON | CrON | CrON |
| Oxygen content (at %) | 10 | 20 | 25 | 30 |
| Etching gas |  | fluorine (F) gas | | |
| Thickness varied by (Å) | 3 | 15 | 25 | 35 |
| OD varied by (@193 nm) | 0.01 | 0.08 | 0.15 | 0.35 |

Referring to Table 3, it is appreciated that the resistance of the film to fluorine (F) gas becomes weaker as the content of oxygen (O) increases with respect to chrome (Cr), and thus variance in the thickness and optical density increases. In particular, if the content of oxygen is higher than 20 at %, the thickness is varied by 15 Å or more and the optical density is varied by 0.1 or higher, and therefore there is a problem that the light-shielding function of the light-shielding film is deteriorated. Accordingly, if the light-shielding film is formed to have two or more layers, the uppermost layer is controlled to contain oxygen not more than 20 at % in order to strengthen the resistance to the fluorine (F) etching gas.

Evaluation of Properties Based on Stacked Structure of the Light-Shielding Film

The etching speed and optical density of the light-shielding film, varying depending on materials and the thickness of the film, were compared with a conventional phase-shift blankmask. In inventive examples 1 to 4 and a comparative example 1, the phase-shift films were equally formed using MoSiN, and the light-shielding films had a two-layer structure of a lower first light-shielding layer and an upper second light-shielding layer.

In the inventive example 1, the first light-shielding layer (CrON) was formed to have a thickness of 480 Å under process gas of Ar:N$_2$:NO=5 sccm:5 sccm:5 sccm and process power of 0.7 kW. Then, the second light-shielding layer (CrN) was formed to have a thickness of 68 Å on the first light-shielding layer under process gas of Ar:N$_2$=5 sccm:3 sccm and process power of 0.65 kW.

In the inventive example 2, the first light-shielding layer (CrON) was formed to have a thickness of 494 Å under process gas of Ar:N$_2$:NO=5 sccm:10 sccm:5 sccm and process power of 0.7 kW. Then, the second light-shielding layer (CrN) was formed to have a thickness of 55 Å on the first light-shielding layer under process gas of Ar:N$_2$=5 sccm:3 sccm and process power of 0.65 kW.

In the inventive example 2, the first light-shielding layer (CrON) was formed to have a thickness of 494 Å under process gas of Ar:N$_2$:NO=5 sccm:10 sccm:5 sccm and process power of 0.7 kW. Then, the second light-shielding layer (CrN) was formed to have a thickness of 75 Å and contain a small content of oxygen (O) on the 5 first light-shielding layer under process gas of Ar:N$_2$:NO=5 sccm:10 sccm:2 sccm and process power of 0.8 kW.

In the comparative example 1, the first light-shielding layer (CrN) was formed to have a thickness of 410 Å on the first light-shielding layer under process gas of Ar:N$_2$=5 sccm:3 sccm and process power of 0.7 kW, and then the second light-shielding layer (CrON) was formed to have a thickness of 120 Å under process gas of Ar:N$_2$:NO=5 sccm:5 sccm:3 sccm and process power of 0.65 kW.

Table 4 shows results of evaluating the etching speeds and optical densities of the light-shielding films according to the inventive examples 1 to 3 and the comparative example 1.

light-shielding layer (CrCON) was formed to have a thickness of 55 Å under process gas of Ar:N2:NO:CH4=5 sccm:5 sccm:1.5 sccm:3 sccm and process power of 1.4 kW.

In this case, the inventive example 4 took an etching time of 380 seconds and had a sheet resistance of 1.2 kΩ/□, and it was therefore appreciated that the sheet resistance is remarkably lowered by adding carbon (C) even though the light-shielding film contains oxygen (O) and nitrogen (N).

TABLE 4

|  |  | Inventive example 1 | Inventive example 2 | Inventive example 3 | Comparative example 1 |
|---|---|---|---|---|---|
| Phase-shift film | Materials | | MoSiN | | |
| | Transmissivity | | 6.1% | | |
| First light-shielding layer | Materials | CrON | CrON | CrON | CrN |
| | process gas (sccm) | Ar:N2:NO = 5:5:5 | Ar:N2:NO = 5:10:5 | Ar:N2:NO = 5:10:5 | Ar:N2 = 5:3 |
| | Film thickness (Å) | 480 | 484 | 484 | 410 |
| | Etching speed (Å/sec) | 2.2 | 2.5 | 2.5 | 1.3 |
| | OD @193 nm | 2.48 | 2.41 | 2.41 | 2.8 |
| Second light-shielding layer | Materials | CrN | CrN | CrON | CrON |
| | process gas (sccm) | Ar:N2 = 5:3 | Ar:N2 = 5:3 | Ar:N2:NO = 5:10:2 | Ar:N2:NO = 5:5:3 |
| | Film thickness (Å) | 68 | 65 | 75 | 120 |
| | the etching speed (Å/sec) | 1.3 | 1.3 | 2.1 | 1.8 |
| | OD @193 nm | 2.92 | 2.95 | 2.92 | 3.05 |
| Average etching speed (Å/sec) | | 2.0 | 2.1 | 2.3 | 1.36 |
| Resist film | Film thickness | | 100 nm | | |
| | Remained by after etching | 27 nm | 28 nm | 37 nm | 0 |

Referring to the inventive examples 1 to 3 and the comparative example 1 in Table 4, there were no significant differences in optical density between the inventive examples 1 to 3 and the comparative example 1 since the inventive examples 1 to 3 have optical densities of 2.92 to 2.95 and the comparative example 1 has an optical density of 3.05. However, the inventive examples 1 to 3 were more improved in the etching speed by 40% than the comparative example 1 since the inventive examples 1 to 3 have etching speeds of 2.0 Å/sec to 2.3 Å/sec and the comparative example 1 has an etching speed of 1.36 Å/sec. Further, the inventive examples 1 to 3 can make the resist film thinner since the resist film of 27 nil to 37 nm remains after the etching process, but the comparative example 1 cannot make the resist film thinner since there is no resist film after the etching process.

Evaluation II of Properties Based on Materials for Light-Shielding Film

The etching speed and sheet resistance of the light-shielding film were measured in accordance with materials and their contents. An inventive example 4, in which a light-shielding film contains carbon (C) was compared with the foregoing comparative example 1.

In the inventive example 4, a first light-shielding layer (CrCON) was formed to have a thickness of 480 Å under process gas of Ar:N2:NO:CH4=3 sccm:9 sccm:3.5 sccm:2 sccm and process power of 0.75 kW, and then a second On the other hand, the comparative example 1 had a sheet resistance of 5Ω/□ but took an etching time of 723 seconds. Thus, it was appreciated that the etching speed of the comparative example 1 is significantly lower than that of the inventive example 4.

Evaluation of Properties Based on Materials for Hard Film

A hard film was additionally formed on the light-shielding film of the phase-shift blankmask according to the examples of the present invention. In inventive examples 5 to 7, the hard film was formed on the two-layer film of chrome (Cr). With this, the properties of the phase-shift blankmask were evaluated based on the materials of the hard film.

In the inventive example 5, the hard film was formed as a layer of MoSiON to have a thickness of 40 Å using a molybdenum silicide (MoSi) target (Mo:Si=5 at %:95 at %) under process gas of Ar:N2:NO=8 sccm:2 sccm:5 sccm and process power of 0.6 kW.

In the inventive example 6, the hard film was formed as a layer of TaON to have a thickness of 70 Å using a tantalum (Ta) target under process gas of Ar:N2:NO=5 sccm:3 sccm:5 sccm and process power of 0.7 kW.

In the inventive example 7, the hard film was formed as a layer of SiBON to have a thickness of 30 Å using a silicon (Si) target doped with boron (B) under process gas of Ar:N2:NO=7 sccm:2 sccm:3 sccm and process power of 0.4 kW.

Table 5 shows variance in the thickness of the remained resist film and the thickness of the light-shielding film after patterning the hard film through the phase-shift blank mask formed with the foregoing hard film.

TABLE 5

|  |  | Inventive example 5 | Inventive example 6 | Inventive example 7 |
|---|---|---|---|---|
| Hard film | Material | MoSiON | TaON | SiBON |
|  | Thickness | 40 Å | 70 Å | 30 Å |
| Resist film | Thickness |  | 1,000 Å |  |
|  | Remained by after etching hard film | 530 Å | 420 Å | 600 Å |
| Variance in thickness of light-shielding film |  | 5 Å | 15 Å | 2 Å |

Referring to Table 5, the resist films were remained by 420 Å to 600 Å after etching the hard film in all the inventive examples, and it was therefore possible to make the resist film thinner. Further, the thickness of the light-shielding film was varied by 2 Å to 15 Å, and it was therefore appreciated that the hard films (MoSiON, TaON, SiBON) have sufficient etch selectivity with regard to the light-shielding film.

Although a few exemplary embodiments have been shown and described, it will be appreciated by those skilled in the art that changes may be made in these exemplary embodiments without departing from the principles and spirit of the invention. Therefore, the foregoing has to be considered as illustrative only. The scope of the invention is defined in the appended claims and their equivalents. Accordingly, all suitable modification and equivalents may fall within the scope of the invention.

According to an embodiment of the present invention, there are provided a phase-shift blankmask including a light-shielding film, which secures a light-shielding effect, improves an etching speed and has a low sheet resistance, and a photomask using the same.

Further, according to an embodiment of the present invention, there are provided a phase-shift blankmask, which can make a resist film thinner to prevent a resist pattern from being damaged, and achieve a fine pattern to secure a high pattern accuracy, and a photomask using the same.

What is claimed is:

1. A phase-shift blankmask, in which a phase-shift film and a light-shielding film are formed on a transparent substrate,
the light-shielding film comprising a metal compound and having a structure being at least one of a multi-layer film and a continuous film, which comprises the structure comprising a first light-shielding layer formed adjacent to the transparent substrate, and a second light-shielding layer formed on the first light-shielding layer,
wherein the second light-shielding layer has a higher optical density at an exposure wavelength per unit thickness (Å) than the first light-shielding layer.

2. The phase-shift blankmask according to claim 1, wherein the first light-shielding layer occupies 50% to 95% of a thickness of the light-shielding film.

3. The phase-shift blankmask according to claim 1, wherein the first and second light-shielding layers are different in a composition ratio from each other while having the same or different composition of materials, and
the first light-shielding layer is more quickly etched in the same etching material than the second light-shielding layer.

4. The phase-shift blankmask according to claim 1, wherein
the first light-shielding layer comprises one selected from a group consisting of CrO, CrON, CrCO and CrCON, and
the second light-shielding layer comprises one selected from a group consisting of CrN, CrO, CrC, CrON, CrCN, CrCO and CrCON.

5. The phase-shift blankmask according to claim 1, wherein
the light-shielding film comprises a chrome (Cr) compound that contains at least one selected from a group consisting of nitrogen (N), oxygen (O), carbon (C), boron (B) and hydrogen (H).

6. The phase-shift blankmask according to claim 5, wherein
the first light-shielding layer contains oxygen (O) of 1 at % to 50 at %, and contains nitrogen (N) of 10 at % to 30 at % if containing nitrogen (N).

7. The phase-shift blankmask according to claim 5, wherein
the first light-shielding layer contains oxygen (O) of 1 at % to 50 at %, and
the second light-shielding layer contains oxygen (O) of 1 at % to 20 at %.

8. The phase-shift blankmask according to claim 5, wherein
the second light-shielding layer essentially comprises carbon (C), and
the first light-shielding layer comprises higher content of at least one of oxygen (O) and nitrogen (N) than the second light-shielding layer.

9. The phase-shift blankmask according to claim 5, wherein
the first light-shielding layer comprises carbon (C) of 0 to 40 at %, and the second light-shielding layer comprises carbon (C) of 1 at % to 50 at %, and
the second light-shielding layer comprises higher content of carbon (C) than the first light-shielding layer.

10. The phase-shift blankmask according to claim 5, wherein
the second light-shielding layer essentially comprises carbon (C), and
the structure where the phase-shift film and the light-shielding film are stacked comprises a sheet resistance of not greater than 30 kΩ/□.

11. The phase-shift blankmask according to claim 1, wherein
the light-shielding film comprises a thickness of 450 Å to 700 Å.

12. The phase-shift blankmask according to claim 1, wherein
the phase-shift film comprises a multi-layer film of two or more layers of a molybdenum silicide (MoSi) compound that contains at least one of materials selected from a group consisting of nitrogen (N), oxygen (O), carbon (C), boron (B) and hydrogen (H), and
the phase-shift film comprises an uppermost layer that contains oxygen (O) of 0.1 at % to 20 at % and has a thickness of 1 Å to 100 Å.

13. The phase-shift blankmask according to claim 1, wherein
the structure where the phase-shift film and the light-shielding film are stacked has an optical density of 2.5 to 3.5 and a surface reflectivity of 20% to 40% with regard to an exposure light wavelength of 193 nm or 248 nm.

14. The phase-shift blankmask according to claim 1, further comprising a hard film provided on a light-shielding film of the phase-shift film,
  wherein an etch-stopping film is selectively provided in between the light-shielding film and the hard film.

15. The phase-shift blankmask according to claim 14, wherein the hard film comprises a thickness of 20 Å to 100 Å.

16. The phase-shift blankmask according to claim 14, wherein
  the light-shielding film, the phase-shift film, the hard film and the etch-stopping film comprise one or more materials selected from a group consisting of silicon (Si), molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf), tungsten (W) and silicon (Si), or the foregoing materials with added one or more materials selected from a group consisting of nitrogen (N), oxygen (O), carbon (C), boron (B) and hydrogen (H).

17. A phase-shift photomask fabricated using the phase-shift blankmask, in which a phase-shift film and a light-shielding film are formed on a transparent substrate,
  the light-shielding film comprising a metal compound and having a structure being one of a multi-layer film and a continuous film, the structure comprising a first light-shielding layer formed adjacent to the transparent substrate, and a second light-shielding layer formed on the first light-shielding layer,
  wherein the second light-shielding layer has a higher optical density at an exposure wavelength per unit thickness (Å) than the first light-shielding layer.

* * * * *